(12) United States Patent
Abe

(10) Patent No.: US 7,952,400 B2
(45) Date of Patent: May 31, 2011

(54) RESET DEVICE

(75) Inventor: Shuhei Abe, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 95 days.

(21) Appl. No.: 11/869,023

(22) Filed: Oct. 9, 2007

(65) Prior Publication Data
US 2008/0106309 A1 May 8, 2008

(30) Foreign Application Priority Data
Nov. 2, 2006 (JP) ................................. 2006-299315

(51) Int. Cl.
*H03L 7/00* (2006.01)
(52) U.S. Cl. ...................................... 327/142; 327/143
(58) Field of Classification Search .................. 327/142, 327/143
See application file for complete search history.

(56) References Cited

U.S. PATENT DOCUMENTS

| | | | | |
|---|---|---|---|---|
| 4,209,713 A | * | 6/1980 | Satou et al. .................... | 327/310 |
| 5,041,741 A | * | 8/1991 | Steele .............................. | 326/33 |
| 5,144,159 A | * | 9/1992 | Frisch et al. ................... | 327/198 |
| 5,179,298 A | * | 1/1993 | Hirano et al. ................... | 326/83 |
| 5,929,674 A | * | 7/1999 | Maccarrone et al. .......... | 327/143 |
| 6,046,604 A | * | 4/2000 | Horiguchi et al. .............. | 326/83 |
| 6,404,239 B1 | * | 6/2002 | Kawahara et al. .............. | 326/121 |
| 6,683,481 B1 | * | 1/2004 | Zhou et al. ..................... | 327/143 |

FOREIGN PATENT DOCUMENTS

JP    09-181586    7/1997

* cited by examiner

*Primary Examiner* — Lincoln Donovan
*Assistant Examiner* — Ryan C Jager
(74) *Attorney, Agent, or Firm* — Ladas & Parry LLP

(57) ABSTRACT

A disclosed reset device for outputting a reset signal based on a magnitude of an input power supply voltage includes: a power supply voltage monitoring unit including a comparator to which a detection voltage detected based on the magnitude of the power supply voltage and a reference voltage to be used as an inversion reference for the reset signal are input, the comparator comparing the detection voltage with the reference voltage and outputting an output voltage in accordance with a result of the comparison; and a reset signal outputting unit including a CMOS inverter to which the output voltage output from the power supply voltage monitoring unit is input, the unit outputting the reset signal. An impedance unit is disposed between a P-channel MOS transistor constituting the inverter and a power supply voltage line and/or between an N-channel MOS transistor constituting the inverter and a ground line.

2 Claims, 9 Drawing Sheets

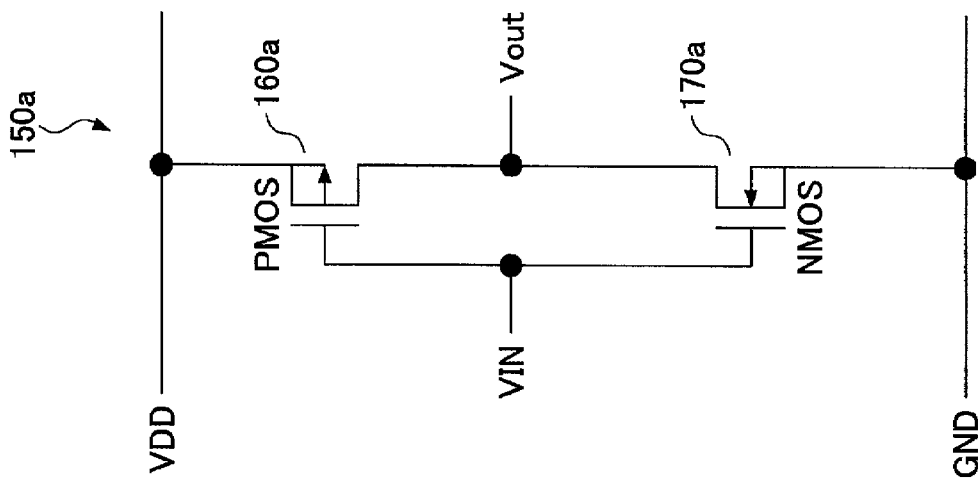
FIG.3A
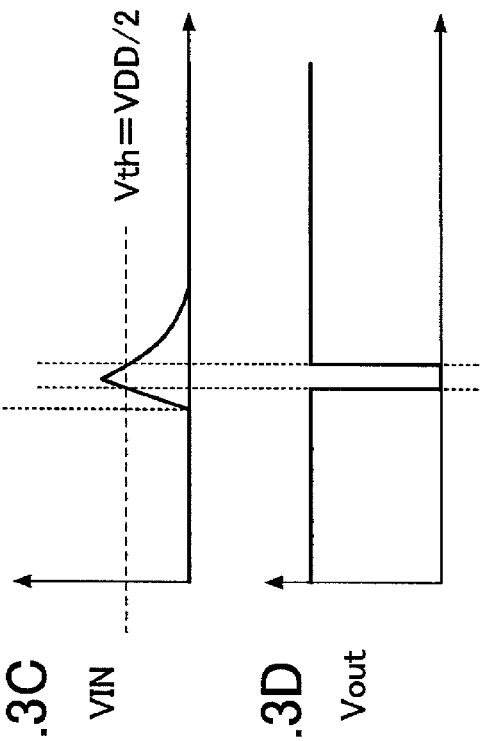
FIG.3B
FIG.3C
FIG.3D

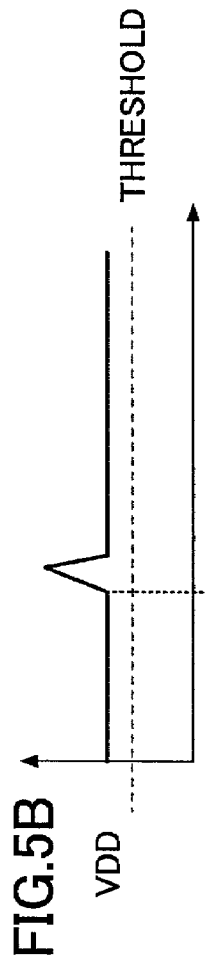
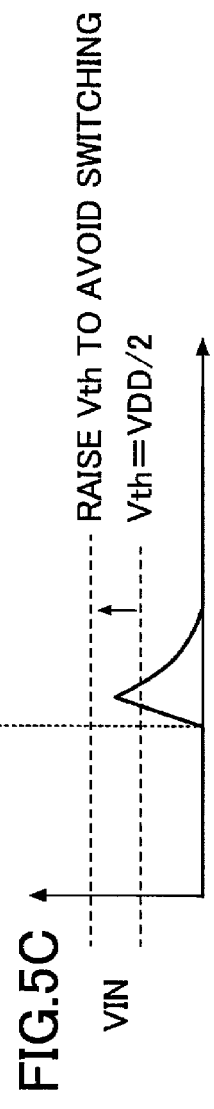
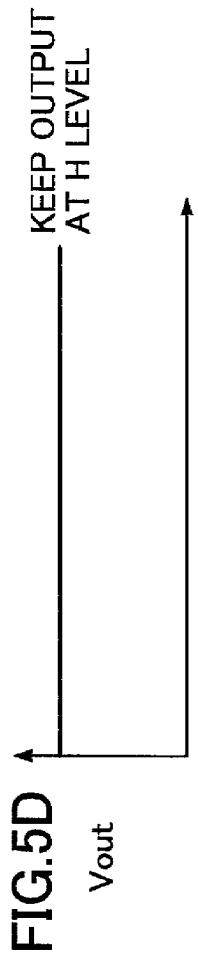
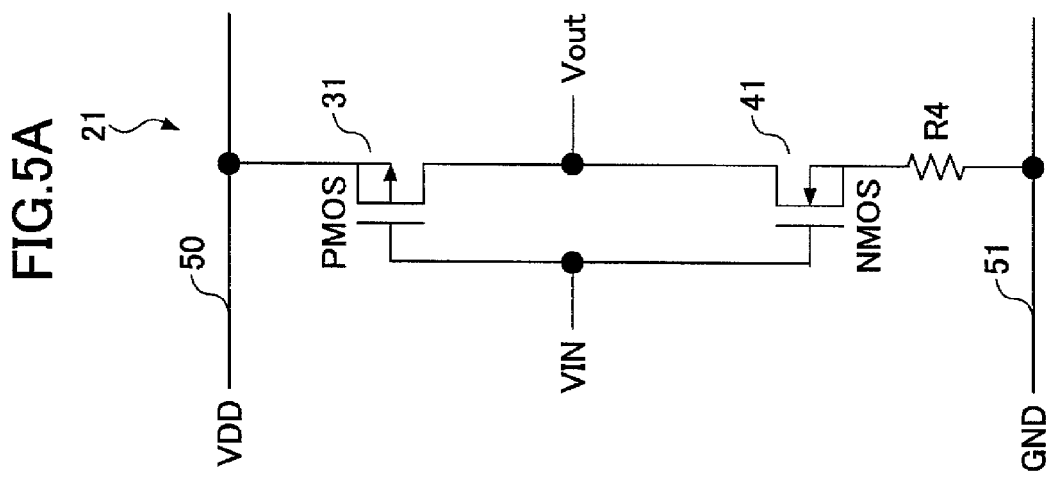

RESET DEVICE

BACKGROUND OF THE INVENTION

1. Field of the Invention

The present invention generally relates to a reset device and more particularly to a reset device outputting a reset signal in accordance with the magnitude of an input power supply voltage.

2. Description of the Related Art

Conventionally, there have been known circuits for generating a reset signal in which a reset signal is generated based on a change of power supply voltage and an initial setting of a system is performed so as to prevent malfunction of a device resulting from an indefinite state of an output logic upon power-on operation of a system on which a CMOS logical circuit such as a flip-flop is mounted (refer to Patent Document 1, for example).

FIG. 1 is a diagram showing a conventional circuit for generating a reset signal. The reset signal generating circuit shown in FIG. 1 includes N-channel MOS transistors 110 and 120, a resistor 130, an inverter 150, an OR operator 180, and an RS flip-flop 190. The inverter 150 is constructed as a CMOS inverter and includes a P-channel MOS transistor 160 and an N-channel MOS transistor 170.

In FIG. 1, when a power supply voltage VDD is applied from an input terminal, a voltage $V_{N1}$ of a node N1 is expressed as VDD-2$V_{TH}$ divided using the resistor 130, where threshold voltages of the N-channel MOS transistors 110 and 120 are $V_{TH}$. On the other hand, thresholds of the P-channel MOS transistor 160 and the N-channel MOS transistor 170 correspond to those of N-channel MOS transistors 110 and 120, respectively, so that a threshold voltage $V_{TH1}$ of the inverter 150 is VDD/2. When the voltage $V_{N1}$ of the node N1 is larger than the threshold voltage $V_{TH1}$ of the inverter 150, the N-channel MOS transistor 170 conducts and outputs an L-level reset signal. By contrast, when the voltage $V_{N1}$ of the node N1 is smaller than the threshold voltage $V_{TH1}$ of the inverter 150, the P-channel MOS transistor 160 conducts and outputs an H-level reset signal.

FIGS. 2A and 2B are waveform charts illustrating operation of a reset signal generating circuit corresponding to the conventional technique shown in FIG. 1. In FIG. 2A, $L_A$ indicates a temporal change of the power supply voltage VDD and $L_B$ indicates a temporal change of the node voltage $V_{N1}$. Further, $V_{TH1}$ indicates the threshold voltage of the inverter 150. In this case, the threshold voltage $V_{TH1}$ of the inverter 150 changes at a half of the temporal change $L_A$ of the power supply voltage VDD and when the node voltage $V_{N1}$ does not exceed the threshold voltage $V_{TH1}$ of the inverter 150, a reset signal R is output at the H level. Then, when the node voltage $V_{N1}$ exceeds the threshold voltage $V_{TH1}$ of the inverter 150, the reset signal R is output at an L level. Further, when the reset signal R is output at the H level, the RS flip-flop 190 is reset and when the reset signal R is output at the L level, logic is maintained.

By constructing in this manner, the reset signal R is output at the H level until the power supply voltage VDD becomes twice the threshold voltage $V_{TH}$ of the N-channel MOS transistors 110 and 120.

Patent Document 1: Japanese Laid-Open Patent Application No. 9-181586

However, in the structure disclosed in above-mentioned Patent Document 1, the inverter 150 may be subject to malfunction when the power supply voltage is rapidly changed.

FIGS. 3A, 3B, 3C, and 3D are diagrams illustrating problems of a CMOS inverter 150a according to the conventional technique. FIG. 3A shows a configuration of the conventional CMOS inverter 150a. In FIG. 3A, the CMOS inverter 150a includes a P-channel MOS transistor 160a and an N-channel MOS transistor 170a. An input VIN is constructed as a common gate an output Vout is constructed as a common drain. A source of the N-channel MOS transistor 170a is connected to a ground line and a source of the P-channel MOS transistor 160a is connected to a power supply voltage VDD line. The CMOS inverter 150a is constructed such that when a voltage at the H level is input to the VIN, the N-channel MOS transistor 170a conducts and outputs at the L level, and when a voltage at the L level is input to the VIN, the P-channel MOS transistor 160a conducts and outputs at the H level.

The following describes a case where the power supply voltage VDD shown in FIG. 3B is input to the CMOS inverter 150a constructed in this manner. FIG. 3B shows a case where the power supply voltage VDD is input at a substantially constant voltage and a rapid voltage change is generated due to a sudden voltage change at the power supply voltage. In this case, as shown in FIG. 3C, the input voltage VIN of the CMOS inverter 150a is raised due to capacity coupling following the rapid change of the power supply voltage. When the value exceeds a threshold $V_{th}$=VDD/2 of the CMOS inverter 150a, as shown in FIG. 3D, the Vout required to be maintained at the H level is changed to be at the L level under the influence of the VIN exceeding the threshold. In this manner, the configuration shown in FIG. 3A poses problems in that the CMOS inverter 150a may be subject to malfunction due to the rapid change of the power supply voltage.

SUMMARY OF THE INVENTION

It is a general object of the present invention to provide an improved and useful reset device in which the above-mentioned problems are eliminated.

A more specific object of the present invention is to provide a reset device that can output a reset signal in a stable manner without causing malfunction of a CMOS inverter even when a power supply voltage is rapidly changed.

According to the present invention, there is provided a reset device for outputting a reset signal based on a magnitude of an input power supply voltage, comprising: a power supply voltage monitoring unit including a comparator to which a detection voltage detected based on the magnitude of the power supply voltage and a reference voltage to be used as an inversion reference for the reset signal are input, the comparator comparing the detection voltage with the reference voltage and outputting an output voltage in accordance with a result of the comparison; and a reset signal outputting unit including a CMOS inverter to which the output voltage output from the power supply voltage monitoring unit is input, the reset signal outputting unit outputting the reset signal, wherein an impedance unit is disposed between a P-channel MOS transistor constituting the inverter and a power supply voltage line and/or between an N-channel MOS transistor constituting the inverter and a ground line. In accordance with this, it is possible to adjust a switching voltage for switching output levels for the reset signal of the CMOS inverter and to set the switching voltage such that the output levels remain unchanged even when the power supply voltage is rapidly changed.

According to another aspect of the present invention, in the reset device, the impedance unit may be a resistance element having a resistance value within a range from not less than 100 kΩ to not more than 3 MΩ. In accordance with this, it is possible to set the switching voltage in the CMOS inverter to be a value within an appropriate range.

According to another aspect of the present invention, in the reset device, the inverter may be disposed in plural stages. In accordance with this, it is possible to set the switching voltage in the CMOS inverter in accordance with any combination.

According to another aspect of the present invention, in the reset signal outputting unit of the reset device, the inverter including the impedance unit disposed between the N-channel MOS transistor and the ground line and the inverter including the impedance unit disposed between the P-channel MOS transistor and the power supply voltage line may be disposed as continuous stages. In accordance with this, it is possible to set the switching voltage in the CMOS inverter in plural stages when the switching voltage is set to be large.

According to the present invention, the switching voltage in the CMOS inverter of the reset device is readily adjusted using the impedance unit. Thus, it is possible to provide a reset device capable of outputting a reset signal in a stable manner without being influenced by a change of the power supply voltage.

Other objects, features and advantage of the present invention will become more apparent from the following detailed description when read in conjunction with the accompanying drawings.

BRIEF DESCRIPTION OF THE DRAWINGS

FIG. 3A is a circuit diagram showing a configuration of a conventional CMOS inverter;

FIG. 3B is a waveform chart illustrating problems of a conventional CMOS inverter;

FIG. 3C is a waveform chart illustrating problems of a conventional CMOS inverter;

FIG. 3D is a waveform chart illustrating problems of a conventional CMOS inverter;

FIG. 5A a circuit diagram showing a configuration of a CMOS inverter in an enlarged manner;

FIG. 5B is a waveform chart illustrating a power supply voltage VDD of a CMOS inverter;

FIG. 5C is a waveform chart illustrating an input VIN of a CMOS inverter;

FIG. 5D is a waveform chart illustrating an output Vout of a CMOS inverter;

DETAILED DESCRIPTION OF THE PREFERRED EMBODIMENTS

In the following, embodiments of the present invention will be described with reference to the accompanying drawings.

Figure 1:
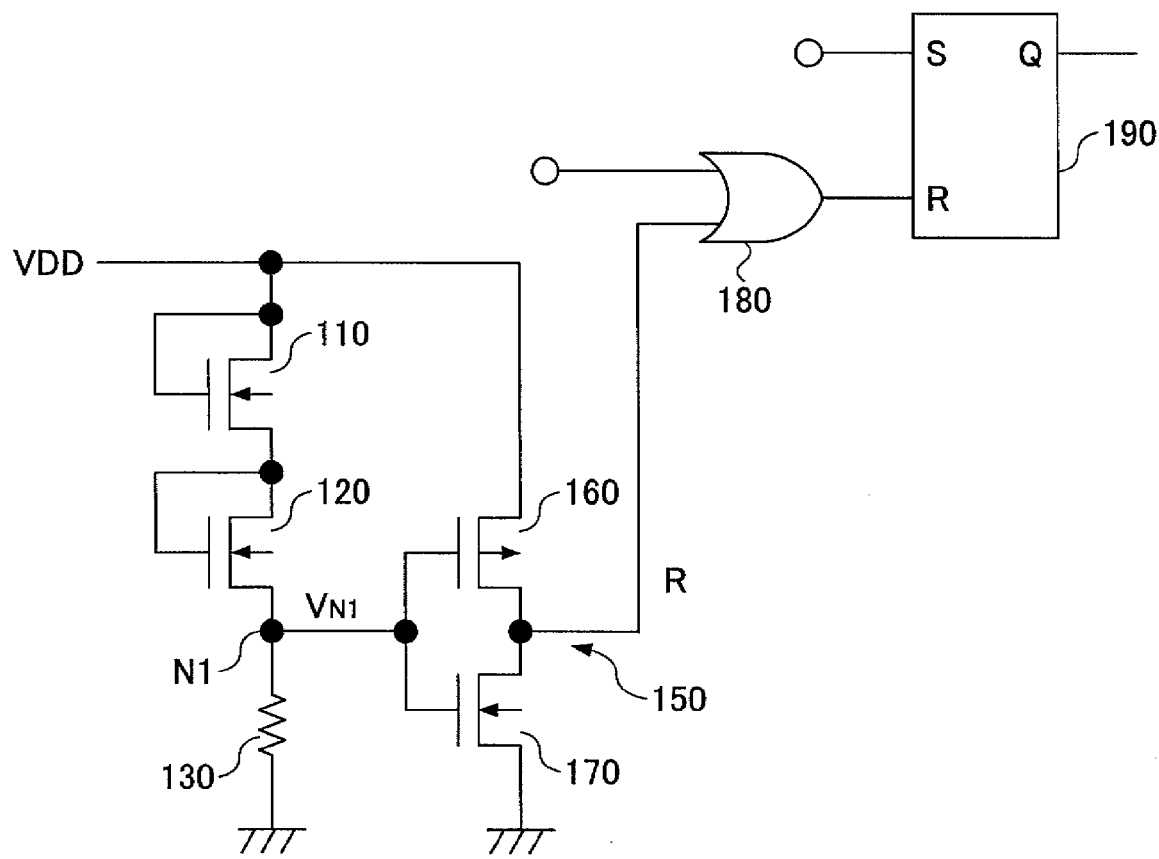
FIG. 1 is a circuit diagram showing a configuration of a conventional circuit for generating a reset signal.
Figure 2A:
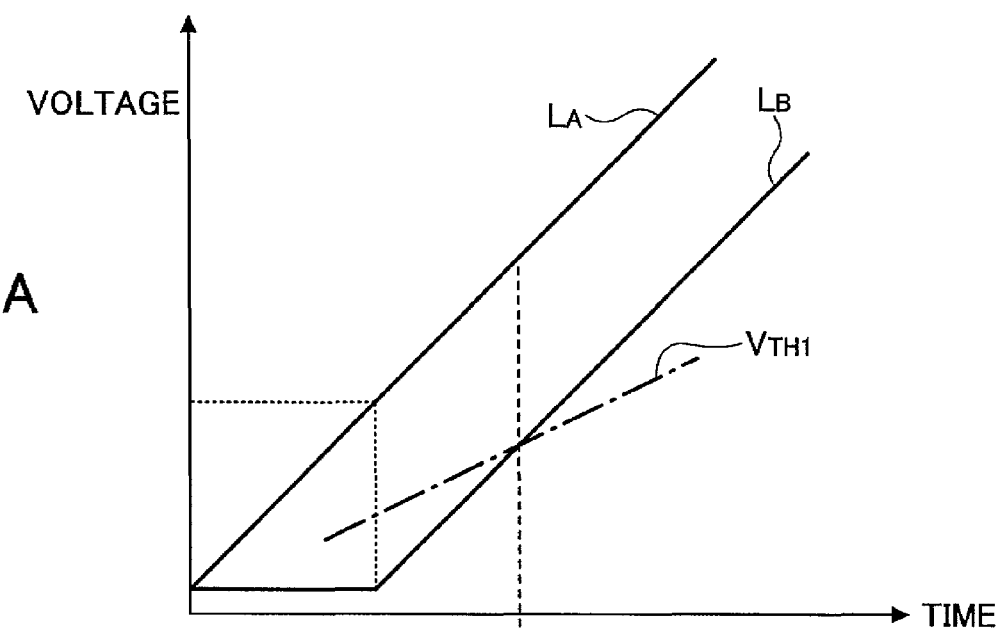
FIG. 2A is a waveform chart illustrating operation of a reset signal generating circuit corresponding to a conventional technique shown in FIG. 1.
Figure 2B:
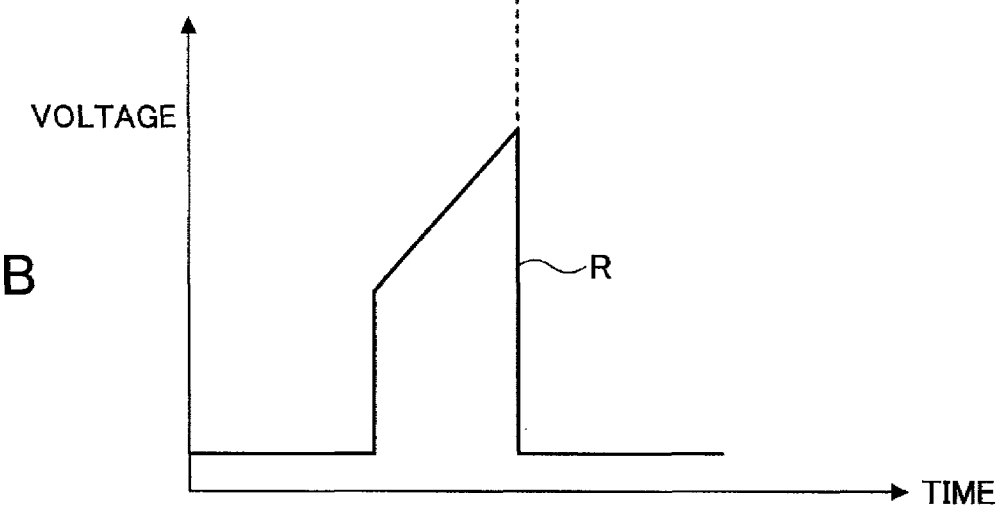
FIG. 2B is a waveform chart illustrating operation of a reset signal generating circuit corresponding to a conventional technique shown in FIG. 1.
Figure 4:
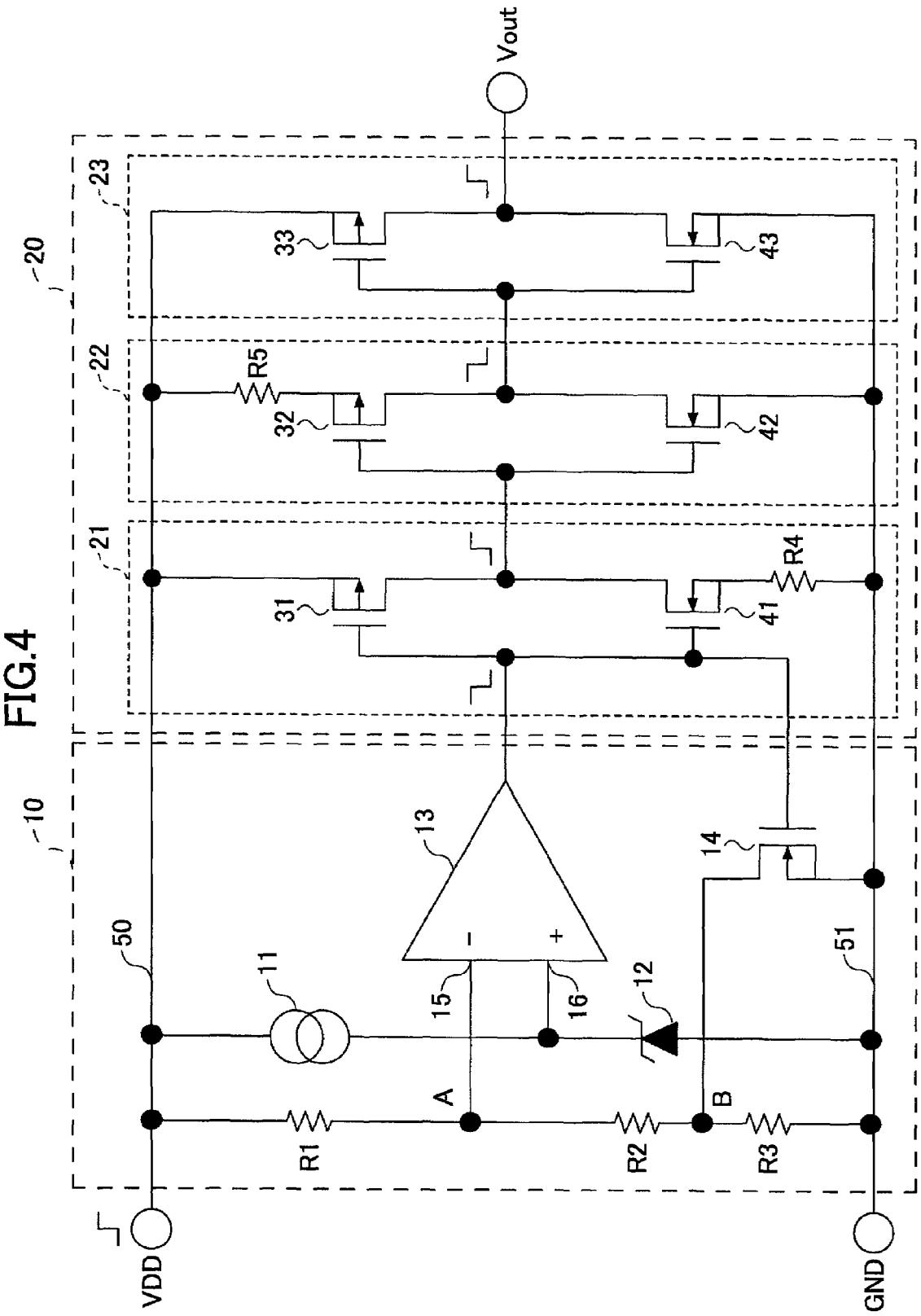
FIG. 4 is a circuit diagram showing an embodiment of a reset device to which the present invention is applied.

FIG. 4 is a circuit diagram showing an embodiment of a reset device to which the present invention is applied. In FIG. 4, the reset device according to the present embodiment includes a power supply voltage input terminal VDD and a ground input terminal GND. A power supply voltage is input between the power supply voltage input terminal VDD and the ground input terminal GND and a reset signal is output from an output terminal Vout. The reset device according to the present embodiment may be applied to a reset IC (integrated circuit), for example. Thus, the reset signal output terminal Vout may be connected to a reset signal input terminal of a CPU (not shown in the drawings) and the reset device may be used as a reset IC for CPU.

In FIG. 4, the reset device according to the present embodiment is substantially separated into a power supply voltage monitoring unit 10 and a reset signal outputting unit 20. The power supply voltage monitoring unit 10 detects a detection voltage based on a power supply voltage supplied between the power supply voltage input terminal VDD and the ground input terminal GND and monitors the magnitude of the power supply voltage. In addition, the power supply voltage monitoring unit 10 compares the detected voltage with a reference voltage and outputs a comparison result. The reset signal outputting unit 20 outputs a reset signal or a reset release signal based on the comparison result output from the power supply voltage monitoring unit 10.

The power supply voltage monitoring unit 10 includes resistors R1, R2, and R3, a constant-current source 11, a Zener diode 12, a comparator 13, and an N-channel MOS (Metal Oxide Semiconductor) transistor 14. The MOS transistor applied to the reset device according to the present embodiment may employ a MOSFET (MOS field-effect transistor).

The resistors R1, R2, and R3 constitute a voltage divider circuit and divide voltage input between the power supply voltage input terminal VDD and the ground input terminal GND in accordance with a resistance ratio so as to detect a detection voltage for comparing with a reference voltage. The detection voltage detected at an A point between the resistor R1 and the resistor R2 is input to an inverting input terminal 15 of the comparator 13.

The constant-current source 11 generates a constant current in accordance with an input voltage. The current generated by the constant-current source 11 is supplied to the Zener diode 12.

The Zener diode 12 generates a voltage in accordance with the current supplied from the constant-current source 11. The voltage generated by the Zener diode 12 is used as the reference voltage and input to a noninverting input terminal 16 of the comparator 13. In other words, the constant-current source 11 and the Zener diode 12 constitute a circuit for generating a reference voltage.

In the comparator 13, the detection voltage detected at the A point in the voltage divider circuit is input to the inversion input terminal 15 and the voltage generated by the Zener diode 12 in the reference voltage generating circuit is input to the noninversion input terminal 16 so as to compare the detection voltage with the reference voltage. If the detection voltage at the point A is assumed to be VA and the reference voltage is assumed to be VREF, the comparator 13 outputs an inversion signal when the detection voltage VA is higher than the reference voltage VREF. By contrast, when the reference voltage VREF is higher than the detection voltage VA, the comparator 13 outputs a noninversion signal. Accordingly, when the detection voltage VA is higher than the reference voltage VREF, the comparator 13 outputs an L-level signal and when the reference voltage VREF higher than the detection voltage VA, the comparator 13 outputs an H-level signal.

In the N-channel MOS transistor 14, a gate is connected to an output terminal of the comparator 13, a drain is connected to a B point between the resistor R2 and the resistor R3 in the voltage divider circuit, and a source is connected to a ground line 51 from the ground input terminal GND. Thus, if the N-channel MOS transistor 14 is set to output a voltage not less than 0.7V and conducts when the output from the comparator 13 is at the H level, an electric potential at the point B becomes 0V.

In accordance with this configuration, a threshold voltage of the detection voltage VA based on the power supply voltage for outputting a reset signal is expressed by VA=VDD*(R2+R3)/(R1+R2+R3) when the detection voltage VA is higher than the reference voltage VREF or by VA=VDD*R1/(R1+R2) when the detection voltage VA is lower than the reference voltage VREF, so that it is possible to set the threshold voltage to have hysteresis.

In the present embodiment, the hysteresis voltage is set for the threshold of the detection voltage based on the power supply voltage for generating the reset signal. However, the detection voltage may be compared with the reference voltage based on the same voltage dividing without setting the hysteresis voltage in particular. In the power supply voltage monitoring unit 10, it is sufficient to determine whether the power supply voltage exceeds the threshold for generating the reset signal or the reset release signal based on the comparison with the reference voltage, so that various types of forms may be applied to the detection of the power supply voltage and a method for setting the reference voltage.

Next, the reset signal outputting unit 20 is described. The reset signal outputting unit 20 includes three stage CMOS (Complementary MOS) inverters 21, 22, and 23. In FIG. 4, the reset signal outputting unit 20 is constructed using the three stage CMOS inverters 21, 22, and 23. However, the reset signal outputting unit 20 may be constructed using a single stage CMOS inverter or may be constructed using five stage CMOS inverters, for example. Further, it is possible to dispose an even number of CMOS inverters as long as matching of inversion and noninversion is obtained.

The CMOS inverters 21, 22, and 23 are constructed using combinations of P-channel MOS transistors 31, 32, and 33 and N-channel MOS transistors 41, 42, and 43, respectively. The CMOS inverters 21, 22, and 23 are configured such that gates of the P-channel MOS transistors 31, 32, and 33 and drains of the N-channel MOS transistors 41, 42, and 43 are respectively connected and each combination has the same input/output terminal.

On the other hand, sources of the P-channel MOS transistors 31, 32, and 33 are connected to a power supply voltage line 50 connected to the power supply voltage input terminal VDD. Further, sources of the N-channel MOS transistors 41, 42, and 43 are connected to the ground line 51 connected to the ground input terminal GND. Moreover, a resistor R4 is disposed as an impedance unit between the N-channel MOS transistor 41 and the ground line 51 and a resistor R5 is disposed as an impedance unit between the P-channel MOS transistor 32 and the power supply voltage line 50.

In the CMOS inverters 21, 22, and 23, when an L-level input signal is input to the gate, the P-channel MOS transistors 31, 32, and 33 conduct, N-channel MOS transistors 41, 42, and 43 do not conduct, and an H-level voltage is output from the drain. By contrast, when an H-level input signal is input to the gate, the P-channel MOS transistors 31, 32, and 33 do not conduct, the N-channel MOS transistors 41, 42, and 43 conduct, and an L-level output signal is output from the drain. In accordance with this, the CMOS inverters 21, 22, and 23 are each configured to output an inversion signal in response to the input signal. In addition, preferably, the P-channel MOS transistors 31, 32, and 33 and the N-channel MOS transistors 41, 42, and 43 are constructed using FETs of the same type such that each transistor is switched on and off using the same switching voltage.

In the following, each of the CMOS inverters 21, 22, and 23 are described. FIGS. 5A, 5B, 5C, and 5D are diagrams illustrating operation of the CMOS inverter 21. FIG. 5A a circuit diagram showing a configuration of the CMOS inverter 21 of FIG. 4 in an enlarged manner.

In FIG. 5A, as mentioned above, the CMOS inverter 21 is constructed using the P-channel MOS transistor 31 and the N-channel MOS transistor 41 in an integrated manner such that both gates and both drains are connected to constitute the input terminal and the output terminal. Further, the resistor R4 is disposed as the impedance unit between the source of the N-channel MOS transistor 41 and the ground line 51.

In FIG. 5A, no impedance unit is disposed between the P-channel MOS transistor 31 and the power supply voltage line 50 while only the resistor R4 is disposed between the N-channel MOS transistor 41 and the ground line 51. Accordingly, when impedance between a VIN and the power supply voltage line 50 is compared with impedance between the VIN and the ground line 51, the impedance between the VIN and the ground line 51 is higher than the impedance between the VIN and the power supply voltage line 50. Thus, current is more readily flown between the VIN and the power supply voltage line 50 in comparison with the case between the VIN and the ground line 51. And, the magnitude of the switching voltage for switching on and off the P-channel MOS transistor 31 and the N-channel MOS transistor 41 is increased.

FIGS. 5B, 5C, and 5D are 5B are waveform charts showing a relationship of voltage waveforms among the power supply voltage input terminal VDD, the input terminal VIN, and the output terminal Vout of the CMOS inverter 21.

In FIG. 5B, the voltage waveform of the power supply voltage input terminal VDD indicates that an input power supply voltage exceeds a threshold of the reset signal and a reset status is released. The following describes a case where a voltage waveform including a rapid voltage change such as a noise is input and voltage becomes high at a certain portion.

In this case, as shown in FIG. 5C, the VIN is influenced by the rapid voltage change of the power supply voltage VDD, so that the voltage of the VIN becomes high at the same time. As described with reference to FIGS. 3A, 3B, and 3C, when Vth=VDD/2 remains unchanged, the portion where the rapid voltage change has occurred exceeds the threshold of the switching voltage of the CMOS inverter 21, so that the L level is temporarily switched to the H level. However, in FIG. 5C, the threshold Vth of the switching voltage is raised, so that the L level is maintained without causing the switching. Thus, the output voltage Vout remains unchanged and it is possible to maintain the output voltage Vout at the H level.

In this manner, by adjusting the impedance between the input terminal VIN of the CMOS inverter 21 and the power supply voltage line 50 using the resistor R4, it is possible to adjust the switching voltage for switching on and off in the CMOS inverter 21 and to construct the CMOS inverter 21 as a stable inverter which is not influenced even when the rapid voltage change has occurred in the power supply voltage.

FIGS. 5A, 5B, 5C, and 5D describe the case where the switching voltage is raised. However, by disposing the resistor R5 as the impedance unit between the P-channel MOS transistor 32 and the power supply voltage line 50 as shown in the CMOS inverter 22 of FIG. 4, it is possible to lower the switching voltage for switching on and off in the CMOS inverter 22. Thus, even when the input voltage VIN at the H level is lowered to some extent due to the rapid voltage change, it is possible to maintain the H-level input and to output an output signal at the L level.

Further, in FIG. 4, the resistor R4 is disposed between the N-channel MOS transistor 41 and the ground line 51 in the CMOS inverter 21 and the resistor R5 is disposed between the P-channel MOS transistor 32 and the power supply voltage line 50 in the CMOS inverter 22, so that the impedance units are disposed continuously on different lines in two stages. In accordance with this, when an input signal to the CMOS inverter 21 is at the H level, an L-level output signal is output as inversion. Then, the L-level signal is input to the following CMOS inverter 22 as an input signal and an H-level signal is output as inversion. Thus, a multistage structure is formed in which both inverters are stable upon voltage change in the same direction (increase direction) relative to the input of the power supply voltage. In this manner, not only by raising the switching voltage in the CMOS inverter 21, but also by lowering the switching voltage in the following CMOS inverter 22, it is possible to deal with the rapid change of the power supply voltage separately in two stages.

In FIG. 4, the CMOS inverter 23 at a third stage includes no resistor. As in this case, it is not necessary to dispose resistors on all of the CMOS inverters 21, 22, and 23 and the switching voltage may be adjusted by disposing the resistor on the stage requiring the resistor. By contrast, the resistors may be disposed on all of the CMOS inverters 21, 22, and 23.

The following describes a relationship between magnitude of resistance in the CMOS inverters 21 and 22 applied to the reset device according to the present embodiment and the switching voltage.

Figure 6:
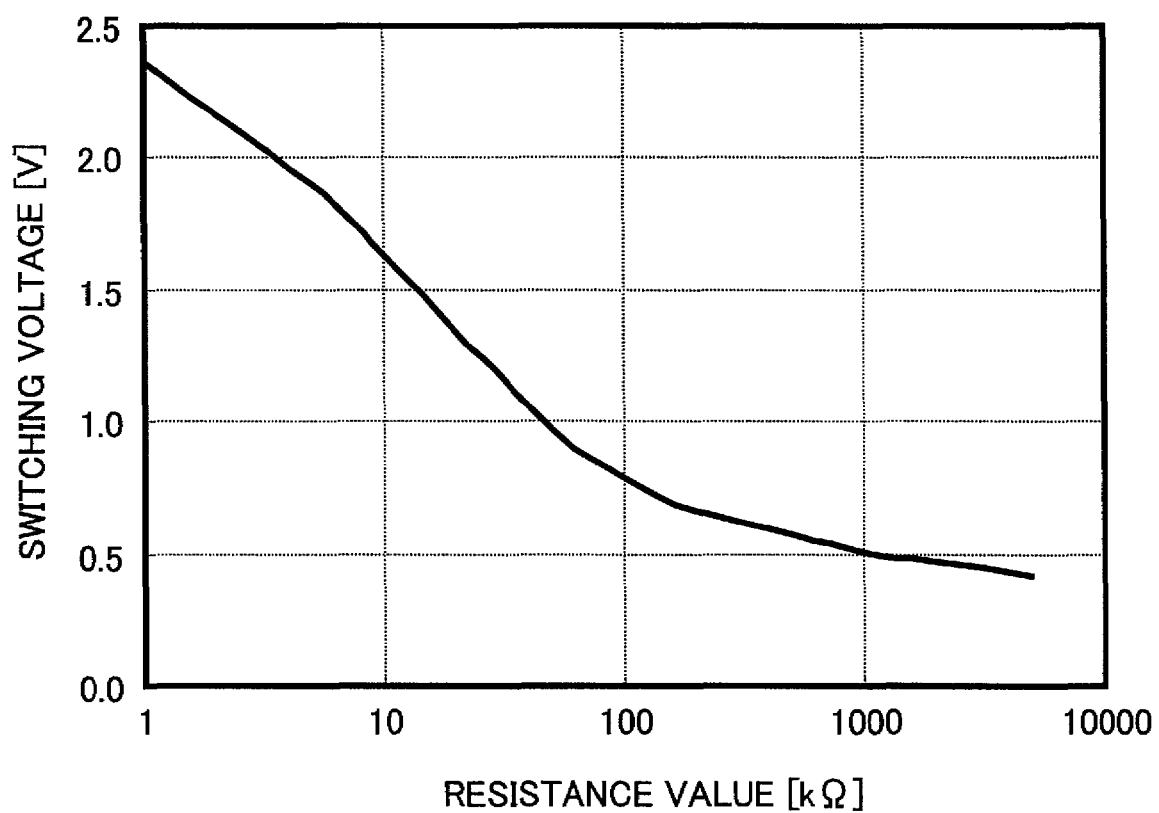
FIG. 6 is a diagram showing a relationship between a resistance value and a switching voltage when a resistor is inserted between a source of a P-channel MOS transistor and a power supply voltage line.

FIG. 6 is a diagram showing a relationship between a resistance value and the switching voltage when the resistor R5 is inserted between the source of the P-channel MOS transistor 32 and the power supply voltage line 50 as in the CMOS inverter 22 shown in FIG. 4. In FIG. 6, a horizontal axis indicates a resistance value (kΩ) and a vertical axis indicates the switching voltage (V).

In FIG. 6, when the resistance value is less than 100 kΩ, a change of the switching voltage in accordance with a change of the resistance value is large. When the resistance value is not less than 100 kΩ, the change of the switching voltage is reduced and becomes stable. When the switching voltage is greatly changed relative to the change of the resistance value in an excessive manner, an influence of the resistor R5 becomes too large, so that the resistor R5 becomes less applicable to an actual circuit. In accordance with this, in FIG. 6, preferably, a resistance value in a relatively stable range not less than 100 kΩ is applied to the resistor R5. For example, preferably, the resistance value of the resistor R5 inserted between the source of the P-channel MOS transistor 32 and the power supply voltage line 50 is within a range from not less than 100 kΩ to not more than 3 MΩ and more preferably within a range from not less than 150 kΩ to not more than 2 MΩ. It is even more preferable to have a range from not less than 200 kΩ to not more than 1 MΩ and the range is optimized at about 300 kΩ, namely, from not less than 250 kΩ to not more than 350 kΩ.

Figure 7:
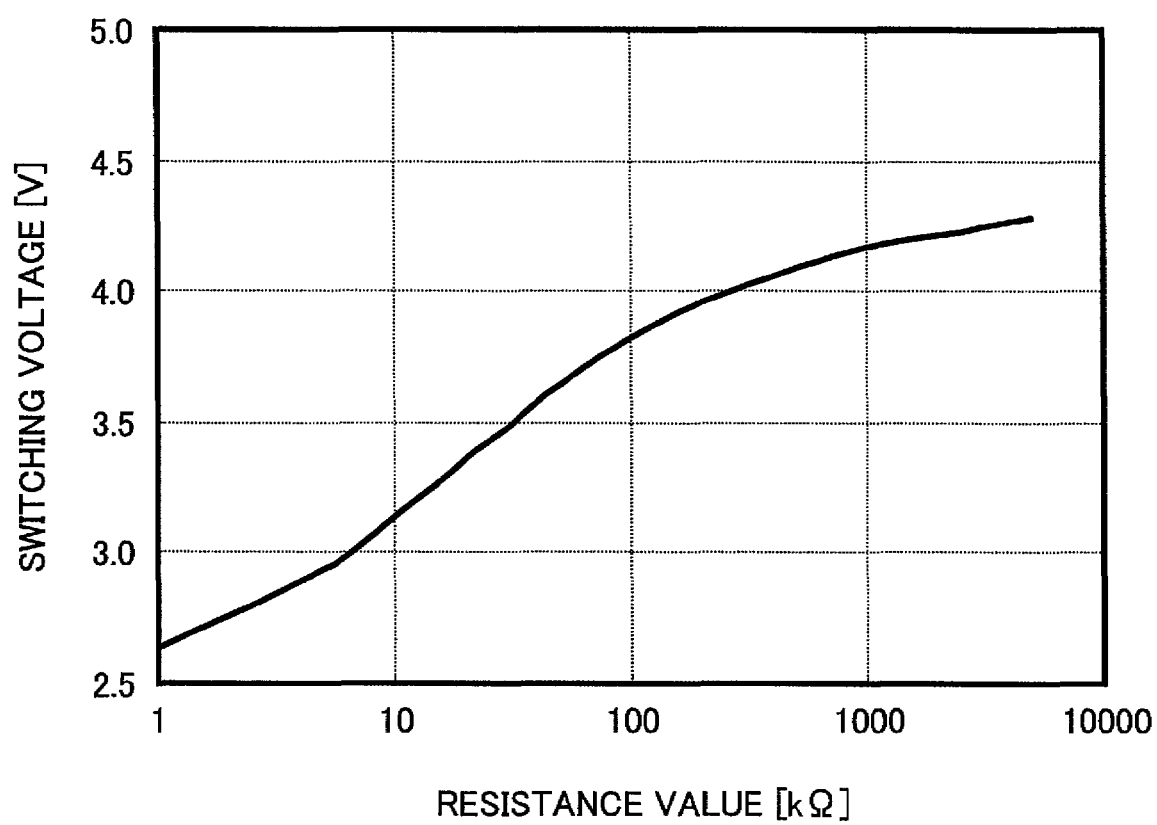
FIG. 7 is a diagram showing a relationship between a resistance value and a switching voltage when a resistor is inserted between a source of an N-channel MOS transistor and a power supply voltage line.

FIG. 7 is a diagram showing a relationship between the resistance value and the switching voltage when the resistor R4 is inserted between the source of the N-channel MOS transistor 41 and the power supply voltage line 50 as in the CMOS inverter 21 shown in FIG. 4, for example. In the same manner as in FIG. 6, a horizontal axis indicates the resistance value (kΩ) and a vertical axis indicates the switching voltage (V).

FIG. 6 and FIG. 7 are different in that FIG. 6 describes decreasing characteristics in the right direction and FIG. 7 describes increasing characteristics in the right direction. However, FIG. 6 and FIG. 7 are the same in that the change of the switching voltage relative to the change of the resistance value is large when the resistance value is less than 100 kΩ and the change of the switching voltage relative to the change of the resistance value is small when the resistance value is not less than 100 kΩ. In this case, when the switching voltage is greatly changed relative to the change of the resistance value in an excessive manner, the resistor R4 becomes less applicable to an actual circuit. In accordance with this, preferably, the resistance value of the resistor R4 is not less than 100 kΩ. Thus, for example, preferably, the resistance value of the resistor R4 inserted between the source of the N-channel MOS transistor 41 and the ground line 51 is within a range from not less than 100 kΩ to not more than 3 MΩ and more preferably within a range from not less than 150 kΩ to not more than 2 MΩ. It is even more preferable to have a range from not less than 200 kΩ to not more than 1 MΩ and the range is optimized at about 300 kΩ, namely, from not less than 250 kΩ to not more than 350 kΩ.

In this manner, the resistance values of the resistor R4 and the resistor R5 in the CMOS inverter 21 and the CMOS inverter 22 applied to the reset device according to the present embodiment are preferably within a range from several 100 kΩ to several MΩ.

Figure 8:
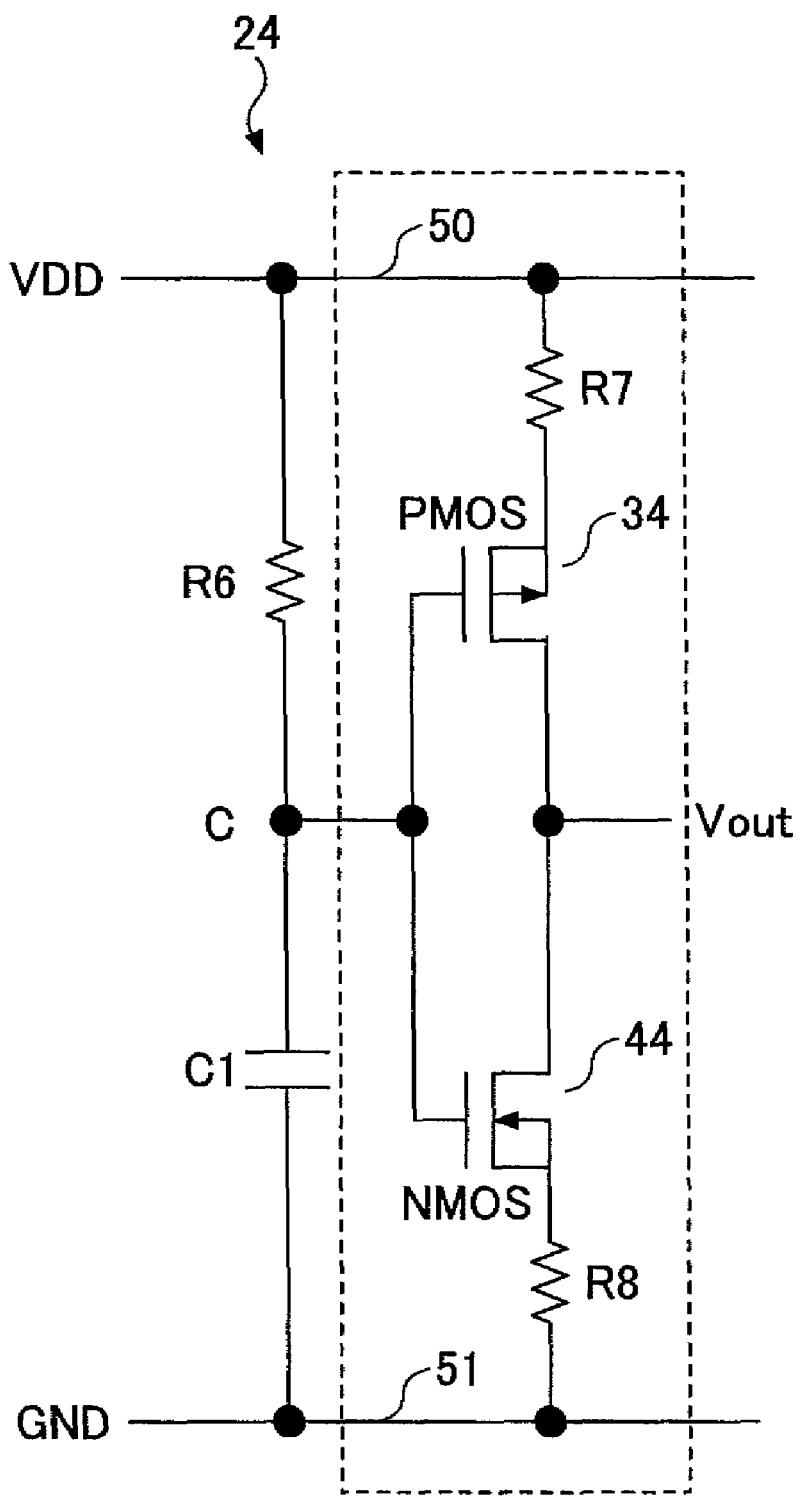
FIG. 8 is a circuit diagram showing a configuration of a CMOS inverter as a variation in a reset device shown in FIG. 4.

FIG. 8 is a circuit diagram showing a configuration of a CMOS inverter 24 as a variation in the reset device shown in FIG. 4.

In FIG. 8, the CMOS inverter 24 is different from the inverter shown in FIG. 4 and FIG. 5A in that the CMOS inverter 24 includes a CR time constant circuit constructed using a resistor R6 and a capacitor C1. Further, the CMOS inverter 24 in FIG. 8 is different from the inverter in FIG. 4 and FIG. 5A in that a resistor R7 is disposed between a P-channel MOS transistor 34 and the power supply voltage line 50 and a resistor R8 is disposed between an N-channel MOS transistor 44 and the ground line 51.

In FIG. 8, by inserting the CR time constant circuit before an input of the CMOS inverter 24, even when the VDD with a square wave is input, a voltage to be input to an input terminal of the CMOS inverter 24 is input with a voltage waveform having rising of time delay.

Figure 9A:
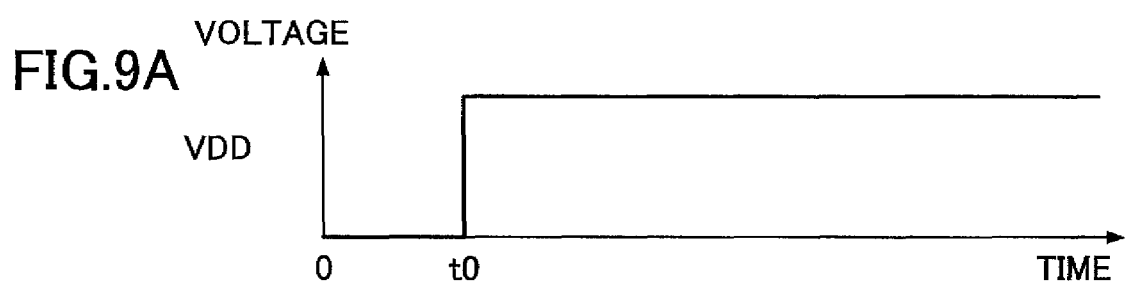
FIG. 9A is a waveform chart illustrating a power supply voltage input terminal VDD of a CMOS inverter shown in FIG. 8.
Figure 9B:
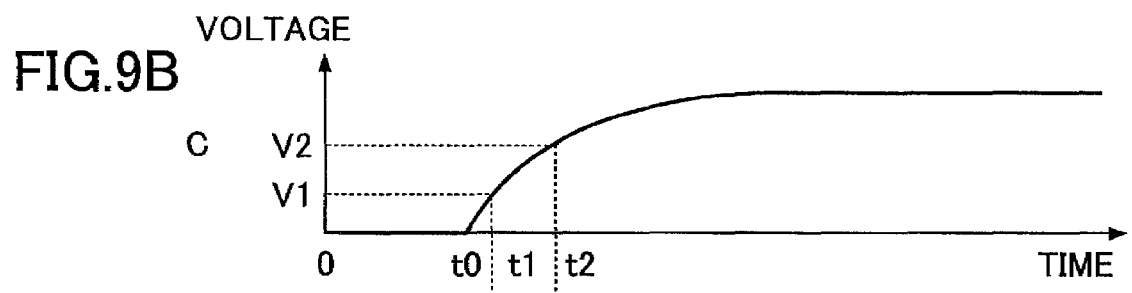
FIG. 9B is a waveform chart illustrating a gate input terminal C of a CMOS inverter shown in FIG. 8.
Figure 9C:
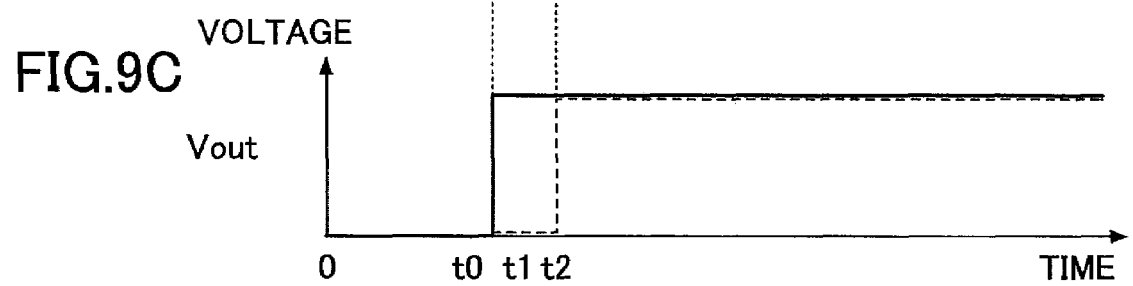
FIG. 9C is a waveform chart illustrating an output voltage terminal Vout of a CMOS inverter shown in FIG. 8.

In the following, operation of the CMOS inverter 24 in FIG. 8 is described with reference to FIGS. 9A, 9B, and 9C. FIGS. 9A, 9B, and 9C are waveform charts illustrating voltage waveforms of a power supply voltage input terminal VDD, a gate input terminal C, and an output voltage Vout. In each waveform chart, a horizontal axis indicates time and a vertical axis indicates magnitude of voltage. FIG. 9A shows a change of the voltage waveform relative to a temporal change of the power supply voltage input terminal VDD. FIG. 9B shows a change of the voltage waveform relative to a temporal change of the gate input terminal C. FIG. 9C shows a change of the voltage waveform relative to a temporal change of the output voltage Vout.

As shown FIG. 9A, when a voltage is input to the power supply voltage input terminal VDD at t=t0, an input voltage to the gate input terminal C in the CMOS inverter 24 is gradually rising as shown in FIG. 9B. In this case, when the switching voltage in the CMOS inverter 24 is set as V1, a switching time is set as t=t1. Accordingly, an output time becomes t=t1 as shown in FIG. 9C.

On the other hand, when the switching voltage is set as V2, the switching time is set as t=t2, as shown in FIG. 9B. Accordingly, Vout is output at t=t2 as shown in FIG. 9C.

In this manner, in the CMOS inverter 24 including the CR time constant circuit, by adjusting and setting the switching voltage relative to the input voltage, it is possible to adjust the output time of the output signal Vout.

With reference to FIG. 8, the configuration and a relationship are described. In FIG. 8, the switching voltage in the CMOS inverter 24 is set using both resistor R7 disposed between the P-channel MOS transistor 34 and the power supply voltage line 50 and resistor RB disposed between the N-channel MOS transistor 44 and the ground line 51. In the configuration shown in FIG. 4 and FIG. 5A, it is sufficient to merely raise or lower the switching voltage, so that the resistor is inserted between one of the MOS transistors and the line. However, in order to adjust the output time, it is necessary to set a ratio of the increase or decrease of the switching voltage in a more accurate manner, so that the adjustment is readily and accurately made by using a resistance ratio on both sides in a quantitative manner. In the same manner as in FIG. 1 and FIGS. 5A, 5B, 5C, and 5D, when a value of the resistor R7 is raised, the switching voltage is lowered and when a value of the resistor RB is raised, the switching voltage is lowered.

When the CR time constant circuit is applied as in the CMOS inverter 24 according to the present embodiment, it is possible to adjust the switching voltage of the output voltage signal Vout by adjusting the relationship between the CR time constant and the CMOS inverter 24.

The present invention is not limited to the specifically disclosed embodiment, and variations and modifications may be made without departing from the scope of the present invention.

The present application is based on Japanese priority application No. 2006-299315 filed Nov. 2, 2006, the entire contents of which are hereby incorporated herein by reference.

What is claimed is:

1. A reset device for outputting a reset signal based on a magnitude of an input power supply voltage, comprising:
   a power supply voltage monitoring unit including a comparator to which a detection voltage detected at a first point in a voltage divider circuit based on the magnitude of the power supply voltage and a reference voltage to be used as an inversion reference for the reset signal are input, the comparator comparing the detection voltage with the reference voltage and outputting an output voltage in accordance with a result of the comparison from an output terminal;
   an N-channel MOS transistor setting a threshold voltage for generating the reset signal having hysteresis, the gate of the N-channel MOS transistor being connected to the output terminal of the comparator, the drain of the N-channel MOS transistor being connected to a second point in the divider circuit, and the source of the N-channel MOS transistor being connected to a ground line, wherein the second point is closer to the ground line than the first point; and
   a reset signal outputting unit outputting the reset signal, the reset signal outputting unit including a first inverter to which the output voltage output from the power supply voltage monitoring unit is input and a second inverter disposed and connected to the first inverter in series as continuous stages, each of the first inverter and the second inverter including a P-channel MOS transistor and an N-channel MOS transistor, wherein
   the first inverter includes a first resistor disposed at one of between a source of the P-channel MOS transistor and a power supply voltage line and between a source of the N-channel MOS transistor included in the first inverter and a ground line, and
   the second inverter includes a second resistor disposed at one of between a source of the P-channel MOS transistor and a power supply voltage line and between a source of the N-channel MOS transistor and a ground line,
      wherein the first resistor and the second resistor are disposed at different lines of the power supply voltage line and ground line in the two serial inverter stages, and
      each of the first resistor and the second resistor is a resistance element having a resistance value within a range from not less than 100 kΩ to not more than 3 MΩ, and where a change of a switching voltage of the first inverter and the second inverter relative to change of the resistance value is smaller than a case when the resistance value is less than 100 kΩ.

2. A reset device for outputting a reset signal based on a magnitude of an input power supply voltage, comprising:
   a power supply voltage monitoring unit including a comparator to which a detection voltage detected based on the magnitude of the power supply voltage and a reference voltage to be used as an inversion reference for the reset signal are input, the comparator comparing the detection voltage with the reference voltage and outputting an output voltage in accordance with a result of the comparison; and
   a reset signal outputting unit outputting the reset signal, the reset signal outputting unit including an inverter to which the output voltage output from the power supply voltage monitoring unit is input, the inverter including a P-Channel MOS transistor and an N-channel MOS transistor,
      wherein a CR time constant circuit composed of a resistor and capacitor to adjust output time of the reset signal is inserted before an input of the inverter, and
      a first resistor is disposed between a source of the P-channel MOS transistor included in the inverter and a power supply voltage line and a second resistor is disposed between a source of the N-channel MOS transistor included in the inverter and a ground line.

* * * * *